(12) United States Patent
Sekiguchi et al.

(10) Patent No.: US 11,749,541 B2
(45) Date of Patent: Sep. 5, 2023

(54) BONDING APPARATUS (71) Applicant: SHINKAWA LTD., Tokyo (JP)

(72) Inventors: Shigeyuki Sekiguchi, Tokyo (JP); Yuji Eguchi, Tokyo (JP); Kohei Seyama, Tokyo (JP)

(73) Assignee: SHINKAWA LTD., Tokyo (JP)

(*) Notice: Subject to any disclaimer, the term of this patent is extended or adjusted under 35 U.S.C. 154(b) by 0 days.

(21) Appl. No.: 17/602,279

(22) PCT Filed: Apr. 7, 2020

(86) PCT No.: PCT/JP2020/015746
§ 371 (c)(1),
(2) Date: Oct. 7, 2021

(87) PCT Pub. No.: WO2020/209269
PCT Pub. Date: Oct. 15, 2020

(65) Prior Publication Data
US 2022/0165591 A1 May 26, 2022

(30) Foreign Application Priority Data

Apr. 11, 2019 (JP) .................... 2019-075412

(51) Int. Cl.
*H01L 21/67* (2006.01)
*H05K 13/04* (2006.01)
(Continued)

(52) U.S. Cl.
CPC .. *H01L 21/67144* (2013.01); *H01L 21/67132* (2013.01); *H01L 24/75* (2013.01);
(Continued)

(58) Field of Classification Search
CPC .............. H01L 21/52; H01L 21/67132; H01L 21/67144; H01L 21/6838;
(Continued)

(56) References Cited

U.S. PATENT DOCUMENTS 7,353,589 B2 * 4/2008 Kawasumi ......... H05K 13/0404
29/742
9,961,817 B2  5/2018 Shimizu et al.
(Continued)

FOREIGN PATENT DOCUMENTS

JP  2011035178  2/2011
JP  2012019189  1/2012
(Continued)

OTHER PUBLICATIONS

"International Search Report (Form PCT/ISA/210) of PCT/JP2020/015746," dated Jun. 23, 2020, with English translation thereof, pp. 1-5.
(Continued)

*Primary Examiner* — Minh N Trinh
(74) *Attorney, Agent, or Firm* — JCIPRNET (57) ABSTRACT

This bonding apparatus is provided with: a tape feeder module which takes out an electronic component from a carrier tape and transfers the electronic component thus taken out; a die supply module which has a die pick-up mechanism for picking up a semiconductor die from a semiconductor wafer bonded to a dicing sheet by pushing up the semiconductor die and which transfers the semiconductor die thus picked up; and a bonding module which arranges, on a circuit substrate, the semiconductor die supplied by the die supply module and/or the electronic component supplied by the tape feeder module.

7 Claims, 7 Drawing Sheets

(51) Int. Cl.
  *H01L 23/00*    (2006.01)
  *H01L 21/683*   (2006.01)
(52) U.S. Cl.
  CPC ...... *H05K 13/0419* (2018.08); *H01L 21/6838* (2013.01); *H01L 2224/7565* (2013.01); *H05K 13/0409* (2018.08)
(58) Field of Classification Search
  CPC ............ H01L 2224/7565; H01L 24/75; H05K 13/0409; H05K 13/0417
  See application file for complete search history.

(56) References Cited

U.S. PATENT DOCUMENTS

| | | |
|---|---|---|
| 10,910,248 B2 | 2/2021 | Seyama |
| 2022/0165591 A1* | 5/2022 | Sekiguchi .......... H05K 13/0417 |

FOREIGN PATENT DOCUMENTS

| | | | |
|---|---|---|---|
| JP | 2016031975 | | 3/2016 |
| KR | 19990034692 | * | 5/1999 |
| WO | 2014049833 | | 4/2014 |
| WO | 2016208069 | | 12/2016 |
| WO | 2017119217 | | 7/2017 |

OTHER PUBLICATIONS

"Office Action of China Counterpart Application" with English translation thereof, dated Jul. 11, 2023, p. 1-p. 15.

* cited by examiner

BONDING APPARATUS

CROSS-REFERENCE TO RELATED APPLICATION

This application is a 371 application of the International PCT application serial no. PCT/JP2020/015746, filed on Apr. 7, 2020, which claims the priority benefits of Japan Patent Application No. 2019-075412, filed on Apr. 11, 2019. The entirety of each of the above-mentioned patent applications is hereby incorporated by reference herein and made a part of this specification.

BACKGROUND

Technical Field

The present invention relates to a bonding apparatus.

Description of Related Art

For example, a central processing unit (CPU), which is a kind of electronic device, includes a surface mount type electronic component such as a capacitor and a semiconductor die such as a CPU chip. The manufacturing process of such an electronic device includes a process of mounting an electronic component and a semiconductor die on a circuit board. For example, Patent Document 1 discloses an apparatus for mounting a die component packed in a carrier tape on a circuit board. Patent Document 2 discloses an apparatus for mounting a semiconductor die on a circuit board.

RELATED ART

Patent Document

[Patent Document 1] International Publication No. WO 2016/208069

[Patent Document 2] International Publication No. WO 2017/119217

SUMMARY

Technical Problem

There are various types of electronic devices in this technical field. An electronic device can have various component configurations according to its function. Each type of electronic device has different types and numbers of electronic components and semiconductor dies mounted on a circuit board.

Therefore, the present invention provides a bonding apparatus capable of supporting production of a wide variety of electronic devices.

Solution to the Problem

An embodiment of the present invention includes: an electronic component supply module that takes out an electronic component from a carrier tape and transfers the taken-out electronic component; a die supply module that has a pickup part for picking up a semiconductor die from a wafer bonded to a dicing sheet by pushing up the semiconductor die, and transfers the picked-up semiconductor die; and a bonding module for arranging at least one of the semiconductor die supplied by the die supply module and the electronic component supplied by the electronic component supply module on a substrate.

The bonding apparatus includes the die supply module that supplies the semiconductor die. Further, the bonding apparatus also includes the electronic component supply module that supplies the electronic component. The bonding module manufactures an electronic device by receiving desired components from the die supply module and the electronic component supply module. Therefore, the bonding apparatus can support the production of an electronic device including at least one of the semiconductor die and the electronic component. As a result, it is possible to support high-mix production of electronic devices.

In a bonding apparatus according to an embodiment, the electronic component supply module may have a first transfer part that transfers out the electronic component taken out from the carrier tape from the electronic component supply module. The die supply module may have a second transfer part that transfers out the picked-up semiconductor die from the die supply module. One of the first transfer part and the second transfer part may be a common transfer path for transferring both the electronic component and the semiconductor die to the bonding module. The other may be an independent transfer path for transferring out one of the electronic component and the semiconductor die to the common transfer path. According to these configurations, the semiconductor die and the electronic component can be suitably provided for the bonding module.

In a bonding apparatus according to an embodiment, the first transfer part and the second transfer part may transfer the semiconductor die and the electronic component in a predetermined transfer direction. According to this configuration, the configuration of the first transfer part and the second transfer part can be simplified.

In a bonding apparatus according to an embodiment, the electronic component supply module, the die supply module, and the bonding module may be arranged in this order along the transfer direction. According to this configuration, the configuration for transferring the electronic component and the semiconductor die can be further simplified.

In a bonding apparatus according to an embodiment, the bonding module may have an arrangement part capable of receiving the electronic component from the first transfer part and arranging the received electronic component on the substrate, and capable of receiving the semiconductor die from the second transfer part and arranging the received semiconductor die on the substrate. According to this configuration, the bonding module can arrange the electronic component and the semiconductor die on the substrate.

Effects

A bonding apparatus according to an embodiment of the present invention is capable of supporting production of a wide variety of electronic devices.

BRIEF DESCRIPTION OF THE DRAWINGS

In FIG. 2, (a) is a diagram showing a state immediately before the die transfer mechanism picks up the semiconductor die. In FIG. 2, (b) is a diagram showing a state immediately after the die transfer mechanism picks up the semiconductor die.

In FIG. 3, (a) a diagram showing a flip operation of the die transfer mechanism. In FIG. 3, (b) is a diagram showing an operation of delivering the semiconductor die.

In FIG. 4, (a) is a diagram showing a state immediately before bonding the semiconductor die. In FIG. 4, (b) is a diagram showing a state of bonding the semiconductor die.

In FIG. 5, (a) is a diagram showing a state of picking up the electronic component. In FIG. 5, (b) is a diagram showing a state of delivering the electronic component from the chip transfer mechanism to the die transfer mechanism.

In FIG. 6, (a) is a diagram showing a state in which the electronic component is delivered from the die transfer mechanism to the bonding head mechanism. In FIG. 6, (b) is a diagram showing a state of bonding the electronic component.

DESCRIPTION OF THE EMBODIMENTS

Hereinafter, embodiments for carrying out the present invention will be described in detail with reference to the accompanying drawings. In the description of the drawings, the same elements are designated by the same reference numerals, and repeated description will be omitted.

Figure 1:
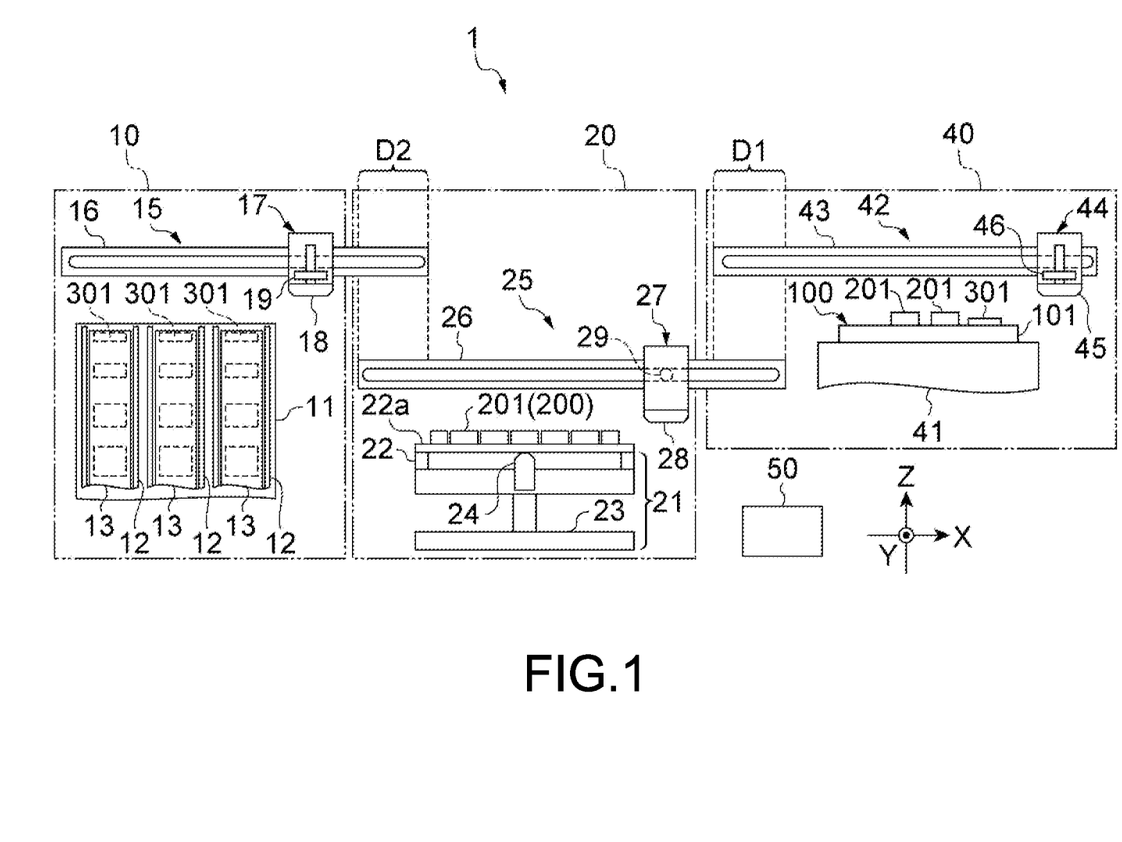
FIG. 1 is a schematic view showing a bonding apparatus according to an embodiment.

The bonding apparatus 1 shown in FIG. 1 is used for manufacturing an electronic device. Specifically, the bonding apparatus 1 is used in a die bonding process of obtaining an intermediate product 100. The intermediate product 100 is obtained in the process of manufacturing an electronic device which is a final product. The intermediate product 100 includes, for example, a circuit board 101, and a semiconductor die 201 and an electronic component 301 mounted on the circuit board 101. The intermediate product 100 finally becomes an electronic device through other manufacturing processes. Further, the bonding apparatus 1 may handle a substrate material different from that of the circuit board 101. For example, a plate-shaped member made of a material such as a semiconductor wafer, metal, glass, or resin can be used as the substrate material.

The bonding apparatus 1 includes a tape feeder module 10 (electronic component supply module), a die supply module 20 (die supply module), a bonding module 40, and a controller 50. The tape feeder module 10, the die supply module 20, and the bonding module 40 are arranged in this order along a predetermined transfer direction (positive X-axis direction). In other words, the die supply module 20 is arranged between the tape feeder module 10 and the bonding module 40. The controller 50 outputs a control signal to each module. The controller 50 is a computer including a CPU, a storage part such as a ROM and a RAM, an input/output part, and a driver. The controller 50 operates the input/output part according to the control of the CPU. Further, the controller 50 reads and writes data in the storage part. These operations generate a control signal supplied to each module. Each module performs each operation such as transfer and pickup based on the control signal.

In the following description, the transfer direction is assumed to be a direction along the X-axis line. It is assumed that the direction from the tape feeder module 10 to the bonding module 40 is the positive X-axis direction. This positive X-axis direction is called the "transfer direction." On the contrary, it is assumed that the direction from the bonding module 40 to the tape feeder module 10 is the negative X-axis direction.

The tape feeder module 10 accommodates multiple electronic components 301 to be supplied to the bonding module 40. The die supply module 20 accommodates multiple semiconductor dies 201 to be supplied to the bonding module 40. The bonding module 40 bonds the semiconductor die 201 and the electronic component 301 to the circuit board 101. This bonding may include an operation of arranging the semiconductor die 201 and the electronic component 301 at desired positions of the circuit board 101 and an operation of fixing the semiconductor die 201 and the electronic component 301 to the circuit board 101 at the desired positions.

The tape feeder module 10 takes out the electronic component 301 from a carrier tape 13. Further, the tape feeder module 10 transfers the taken-out electronic component 301. The tape feeder module 10 includes a reel drive mechanism 11 and a chip transfer mechanism 15 (first transfer part).

A reel 12 is mounted on the reel drive mechanism 11. The carrier tape 13 is wound around the reel 12. The carrier tape 13 is used for transferring and storing the electronic component 301. The electronic component 301 is, for example, a surface mount type component. The carrier tape 13 has pockets for individually accommodating the electronic components 301. The electronic components 301 are accommodated one by one in the pockets. The reel drive mechanism 11 unwinds the carrier tape 13 from the reel 12 to arrange the electronic component 301 at a position where the chip transfer mechanism 15 can pick it up. Further, the pocket of the carrier tape 13 may accommodate multiple electronic components 301. Further, the carrier tape 13 may hold the electronic component 301 by adhesion or the like.

The chip transfer mechanism 15 performs a transfer operation of the electronic component 301. The chip transfer mechanism 15 is an independent transfer path. The chip transfer mechanism 15 transfers out the electronic component 301 to a die transfer mechanism 25 (common transfer path) to be described later. The transfer operation includes an operation of moving the electronic component 301 to a position where it can be delivered to the die supply module 20, and an operation of delivering the electronic component 301 to the die supply module 20.

The chip transfer mechanism 15 picks up the electronic component 301. Next, the chip transfer mechanism 15 delivers the picked-up electronic component 301 to the die transfer mechanism 25. The chip transfer mechanism 15 has a chip transfer guide 16 and a chip head 17. The chip transfer guide 16 moves the chip head 17 in the X-axis direction. The chip transfer mechanism 15 has one chip head 17. However, the number of chip heads 17 included in the chip transfer mechanism 15 is not limited to one. For example, the chip transfer mechanism 15 may have two chip heads 17.

The chip head 17 includes a chip nozzle 18 and a chip motor 19. The chip nozzle 18 is a tip part of the chip head 17. The chip nozzle 18 detachably holds the electronic component 301. This holding may utilize, for example, vacuum suction. The chip nozzle 18 has a touch sensor. The output of the touch sensor is used for the delivery operation of the electronic component 301. The chip motor 19 reciprocally moves the chip nozzle 18 in the Z-axis direction. This reciprocal movement is used for the operation of picking up the electronic component 301 from the carrier tape 13 and the operation of delivering the electronic component 301. Further, the chip head 17 may further include a flip mechanism. By providing the flip mechanism, the electronic component 301 can be delivered to the die transfer mechanism 25 (to be described later) in a desired manner regardless of the accommodation mode of the electronic component 301 in the carrier tape 13.

The die supply module 20 includes a die pickup mechanism 21 (pickup part) and a die transfer mechanism 25 (second transfer part).

A semiconductor wafer 200 is arranged in the die pickup mechanism 21. The die pickup mechanism 21 includes a wafer holder 22, a wafer position adjusting part 23, and a push-up pin 24. The die supply module 20 has the push-up pin 24. The push-up pin 24 pushes up the semiconductor die 201. By this push-up, the semiconductor die 201 is picked up from the semiconductor wafer 200 bonded to a dicing sheet 22a. Then, the die supply module 20 transfers the picked-up semiconductor die 201.

The bonded semiconductor wafer 200 is held on the dicing sheet 22a of an annular wafer holder 22. The semiconductor wafer 200 is a product after the dicing process. The semiconductor wafer 200 is cut into individual pieces, leaving the dicing sheet 22a. The wafer position adjusting part 23 adjusts the relative position of the push-up pin 24 with respect to the wafer holder 22. In other words, the wafer position adjusting part 23 translates the wafer holder 22 in the X-axis direction and the Y-axis direction. Further, the wafer position adjusting part 23 rotates the wafer holder 22 around the Z axis. For example, the wafer position adjusting part 23 may have a stage that can move in the Y-axis direction and a pulse motor that can rotate around the Z axis. Along with these operations, the semiconductor wafer 200 also translates in the X-axis direction and the Y-axis direction, and also rotates around the Z axis. By these operations, the wafer position adjusting part 23 moves the semiconductor die 201 to be picked up onto the push-up pin 24. Further, the wafer position adjusting part 23 may move in both the X-axis direction and the Y-axis direction.

The push-up pin 24 moves in the X-axis direction with respect to the wafer holder 22. Further, the push-up pin 24 moves reciprocally along the Z-axis direction. The power of the X-axis direction movement and the reciprocal movement is supplied by a drive motor (not shown). The tip of the push-up pin 24 arranged at the standby position does not come into contact with the dicing sheet 22a. The tip of the push-up pin 24 arranged at the push-up position comes into contact with the dicing sheet 22a. More specifically, the tip of the push-up pin 24 protrudes slightly from the position where the semiconductor die 201 is arranged. By this protrusion, the semiconductor die 201 is pushed upward (in the positive Z-axis direction). Further, the push-up pin 24 may move in both the X-axis direction and the Y-axis direction.

As described above, the die pickup mechanism 21 can push up the desired semiconductor die 201 by the wafer holder 22 moving in the Y-axis direction and the push-up pin 24 moving in the X-axis direction and the Z-axis direction.

The die transfer mechanism 25 performs a transfer operation of the semiconductor die 201. The die transfer mechanism 25 is a common transfer path for transferring both the electronic component 301 and the semiconductor die 201 to the bonding module 40. The transfer operation includes an operation of moving the electronic component 301 and the semiconductor die 201 to positions where they can be delivered to the bonding module 40, and an operation of delivering the electronic component 301 and the semiconductor die 201 to the bonding module 40.

The die transfer mechanism 25 picks up the semiconductor die 201. Next, the die transfer mechanism 25 delivers the picked-up semiconductor die 201 to the bonding module 40. Further, the die transfer mechanism 25 receives the electronic component 301 from the tape feeder module 10 as an operation different from the above operation. Next, the die transfer mechanism 25 delivers the received electronic component 301 to the bonding module 40. That is, the die transfer mechanism 25 functions as a bridge for the electronic component 301 between the tape feeder module 10 and the bonding module 40.

The die transfer mechanism 25 has a die transfer guide 26 and a die head 27. The die transfer guide 26 moves the die head 27 in the X-axis direction. The die transfer mechanism 25 has one die head 27. However, the number of die heads 27 is not limited to one. For example, the die transfer mechanism 25 may have two die heads 27.

The die head 27 has a die nozzle 28 and a flip mechanism 29. The die nozzle 28 is a tip part of the die head 27. The die nozzle 28 detachably holds the semiconductor die 201 and the electronic component 301. This holding may utilize, for example, vacuum suction. Further, the die head 27 may have a die motor that reciprocally moves the die nozzle 28 in the Z-axis direction.

The die nozzle 28 detachably holds the semiconductor die 201 and the electronic component 301. That is, the die nozzle 28 picks up the semiconductor die 201. The die nozzle 28 delivers the picked-up semiconductor die 201 to the bonding module 40. The die nozzle 28 receives the electronic component 301 from the chip transfer mechanism 15. The die nozzle 28 delivers the received electronic component 301 to the bonding module 40.

The flip mechanism 29 changes the orientation of the die head 27. The orientation of the die head 27 may be, for example, the orientation of the normal line of the suction surface of the die nozzle 28. That is, when the semiconductor die 201 is picked up, the direction of the normal line of the suction surface is downward (in the negative Z-axis direction). In addition, when the semiconductor die 201 is delivered, the direction of the normal line of the suction surface is upward (in the positive Z-axis direction). Such an operation of turning upside down is called a flip operation.

The bonding module 40 includes a substrate transfer mechanism 41 and a bonding head mechanism 42 (arrangement part).

The substrate transfer mechanism 41 takes out the circuit board 101 from a stocker (not shown). The substrate transfer mechanism 41 transfers the circuit board 101 to a position where bonding is performed. The substrate transfer mechanism 41 accommodates the intermediate product 100 obtained by bonding in another stocker (not shown).

The bonding head mechanism 42 is arranged above the substrate transfer mechanism 41. The bonding head mechanism 42 receives the semiconductor die 201 and the electronic component 301 from the die transfer mechanism 25. The bonding head mechanism 42 transfers the received semiconductor die 201 and electronic component 301 to desired positions on the circuit board 101. Then, the bonding head mechanism 42 fixes (die-bonds) the semiconductor die 201 and the electronic component 301 to the circuit board 101.

The bonding head mechanism 42 includes a component transfer guide 43 and a mounting head 44. The component transfer guide 43 moves the mounting head 44 in at least one of the X-axis direction and the Y-axis direction. The bonding head mechanism 42 has one mounting head 44. However, the number of mounting heads 44 is not limited to one. For example, the bonding head mechanism 42 may have two mounting heads 44.

The mounting head 44 detachably holds the semiconductor die 201 and the electronic component 301. The mounting head 44 receives the semiconductor die 201 and the electronic component 301 from the die transfer mechanism 25.

This reception includes an operation in which the die transfer mechanism 25 releases the suction of the semiconductor die 201 and the electronic component 301, and an operation in which the mounting head 44 sucks the semiconductor die 201 and the electronic component 301.

The mounting head 44 has a mounting nozzle 45 and a mounting motor 46. Further, the mounting head 44 has a heater (not shown). The mounting nozzle 45 is a tip part of the mounting head 44. The mounting nozzle 45 detachably holds the semiconductor die 201 and the electronic component 301. This holding may utilize, for example, vacuum suction. The mounting motor 46 reciprocally moves the mounting nozzle 45 in the Z-axis direction. This movement is used for delivering the semiconductor die 201 and the electronic component 301 from the die transfer mechanism 25 to the mounting head 44. Further, this movement is also used for arranging the received semiconductor die 201 and electronic component 301 on the circuit board 101.

Hereinafter, the operation of the bonding apparatus 1 will be described. In the following description, the operation of mounting the semiconductor die 201 and the operation of mounting the electronic component 301 will be described. Further, in order to obtain the intermediate product 100, the controller 50 may execute the operation of mounting the semiconductor die 201 and the operation of mounting the electronic component 301 in a desired order. For example, the controller 50 may perform the operation of mounting the electronic component 301 after performing the operation of mounting the semiconductor die 201. The controller 50 may perform the operation of mounting the semiconductor die 201 after performing the operation of mounting the electronic component 301.

Figure 2:
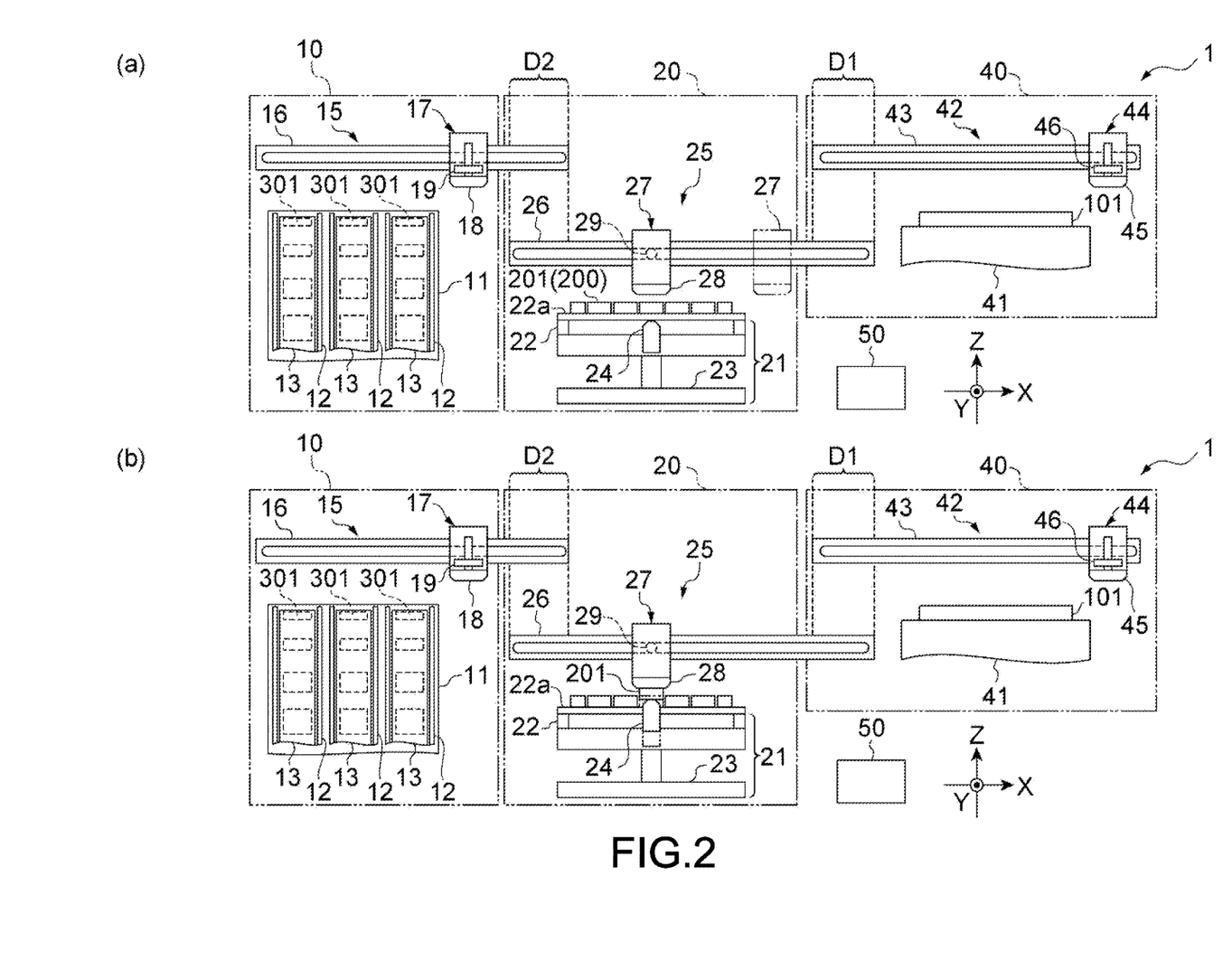

First, the operation of mounting the semiconductor die 201 will be described. As shown in (a) of FIG. 2, the controller 50 outputs a control signal to the die transfer mechanism 25. As a result, the die head 27 moves to a predetermined position. The predetermined position is above the position where the semiconductor die 201 is to be picked up. For example, the predetermined position may be on the axis of the push-up pin 24. At this time, the controller 50 controls the die head 27 downward. By this control, the suction surface of the die nozzle 28 faces the semiconductor die 201.

As shown in (b) of FIG. 2, the controller 50 outputs a control signal to the die pickup mechanism 21. As a result, the semiconductor die 201 to be picked up moves to be directly above the push-up pin 24. The die pickup mechanism 21 that has received the control signal moves the wafer holder 22 in the X-axis direction and/or the Y-axis direction. Further, the die pickup mechanism 21 rotates the wafer holder 22 around the Z axis as needed. By these operations, the semiconductor die 201 to be picked up is positioned directly above the push-up pin 24.

Next, the controller 50 outputs a control signal to the die pickup mechanism 21. As a result, the semiconductor die 201 is pushed up. The die pickup mechanism 21 that has received the control signal moves the push-up pin 24 upward (in the positive Z-axis direction). By this push-up operation, the semiconductor die 201 moves upward (in the positive Z-axis direction). In other words, the semiconductor die 201 moves toward the die nozzle 28.

The controller 50 outputs a control signal to the die transfer mechanism 25. As a result, the suction operation of the die nozzle 28 is started. The timing at which the suction operation is started may be immediately after the die head 27 has moved to a predetermined position. Further, the start timing may be the same as the start of the push-up operation.

Figure 3:
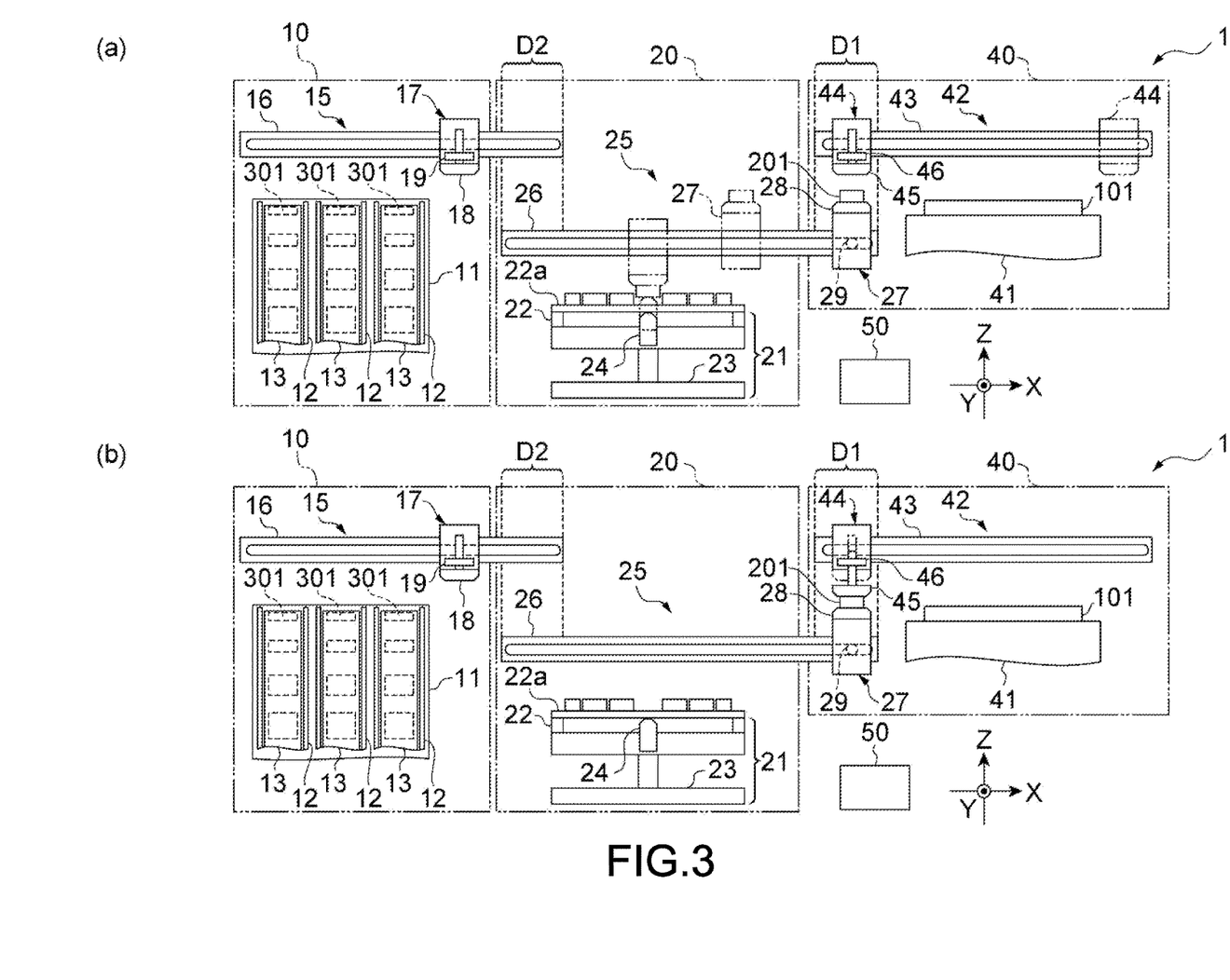

As shown in (a) of FIG. 3, the controller 50 outputs a control signal to the die transfer mechanism 25. As a result, the die head 27 moves to a position where the semiconductor die 201 can be delivered. The position capable of delivery may be an overlapping region D1 between the die transfer guide 26 and the component transfer guide 43. The overlapping region D1 is set in the bonding module 40, for example. The die transfer mechanism 25 that has received the control signal moves the die head 27 in the positive X-axis direction. Further, the die transfer mechanism 25 changes the orientation of the die head 27 to be upward (flip operation). By this operation, the semiconductor die 201 faces the suction surface of the mounting nozzle 45.

Further, the controller 50 also outputs a control signal to the bonding head mechanism 42. As a result, the mounting head 44 moves to a position (overlapping region D1) where the semiconductor die 201 can be received. The bonding head mechanism 42 that has received the control signal moves the mounting head 44 in the negative X-axis direction. Then, the bonding head mechanism 42 stops moving when the mounting head 44 reaches the overlapping region D1.

In addition, the controller 50 may adjust the relative position of the mounting head 44 with respect to the die head 27 after the die head 27 and the mounting head 44 are moved to the overlapping region D1 respectively.

As shown in (b) of FIG. 3, the controller 50 outputs a control signal to the bonding head mechanism 42. As a result, the bonding head mechanism 42 receives the semiconductor die 201. The bonding head mechanism 42 that has received the control signal moves the mounting nozzle 45 downward (in the negative Z-axis direction) by driving the mounting motor 46. The bonding head mechanism 42 brings the mounting nozzle 45 close to the semiconductor die 201 to a distance where the semiconductor die 201 can be sucked. Then, the bonding head mechanism 42 starts the suction operation of the mounting nozzle 45.

The controller 50 outputs a control signal to the die transfer mechanism 25. As a result, the suction operation of the die nozzle 28 is stopped. When the suction operation of the mounting nozzle 45 is started and the suction operation of the die nozzle 28 is stopped, the semiconductor die 201 is delivered from the die transfer mechanism 25 to the bonding head mechanism 42.

Figure 4:
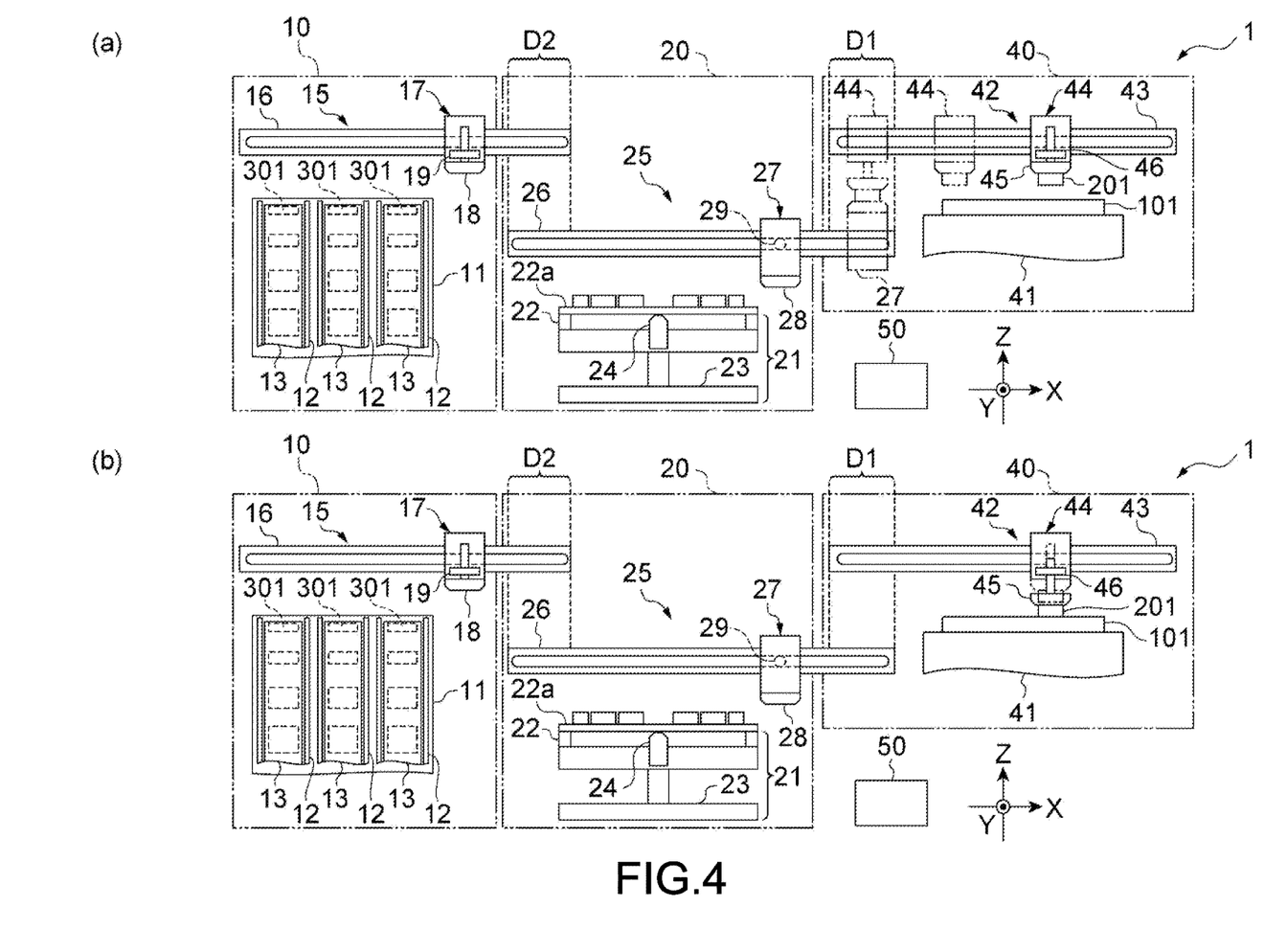

As shown in (a) of FIG. 4, the controller 50 outputs a control signal to the bonding head mechanism 42. As a result, the bonding head mechanism 42 bonds the semiconductor die 201 to the circuit board 101. The bonding head mechanism 42 that has received the control signal first drives the mounting motor 46 to move the mounting nozzle 45 that has sucked the semiconductor die 201 upward (in the positive Z-axis direction). Next, the bonding head mechanism 42 drives the component transfer guide 43 to move the mounting head 44 in the positive X-axis direction. The bonding head mechanism 42 stops moving when the position of the mounting head 44 reaches a predetermined position. The predetermined position may be directly above the position where the semiconductor die 201 is to be bonded.

As shown in (b) of FIG. 4, the bonding head mechanism 42 moves the mounting nozzle 45 downward (in the negative Z-axis direction) to a position where the suction of the semiconductor die 201 can be released by driving the mounting motor 46. Then, the bonding head mechanism 42 stops the suction operation of the mounting nozzle 45. Further, the bonding head mechanism 42 may perform an operation of curing the adhesive arranged between the semiconductor die 201 and the circuit board 101 via the semiconductor die 201, if necessary. For example, the bonding head mechanism 42 may drive a heater to apply heat and/or pressure to the adhesive via the semiconductor die 201.

In addition, if necessary, the controller 50 may output a control signal to the die transfer mechanism 25 to return the die head 27 to the initial position. Further, the controller 50 may output a control signal to the die transfer mechanism 25 to perform an operation of picking up the next semiconductor die 201.

The semiconductor die 201 is mounted on the circuit board 101 by the above series of operations.

Figure 5:
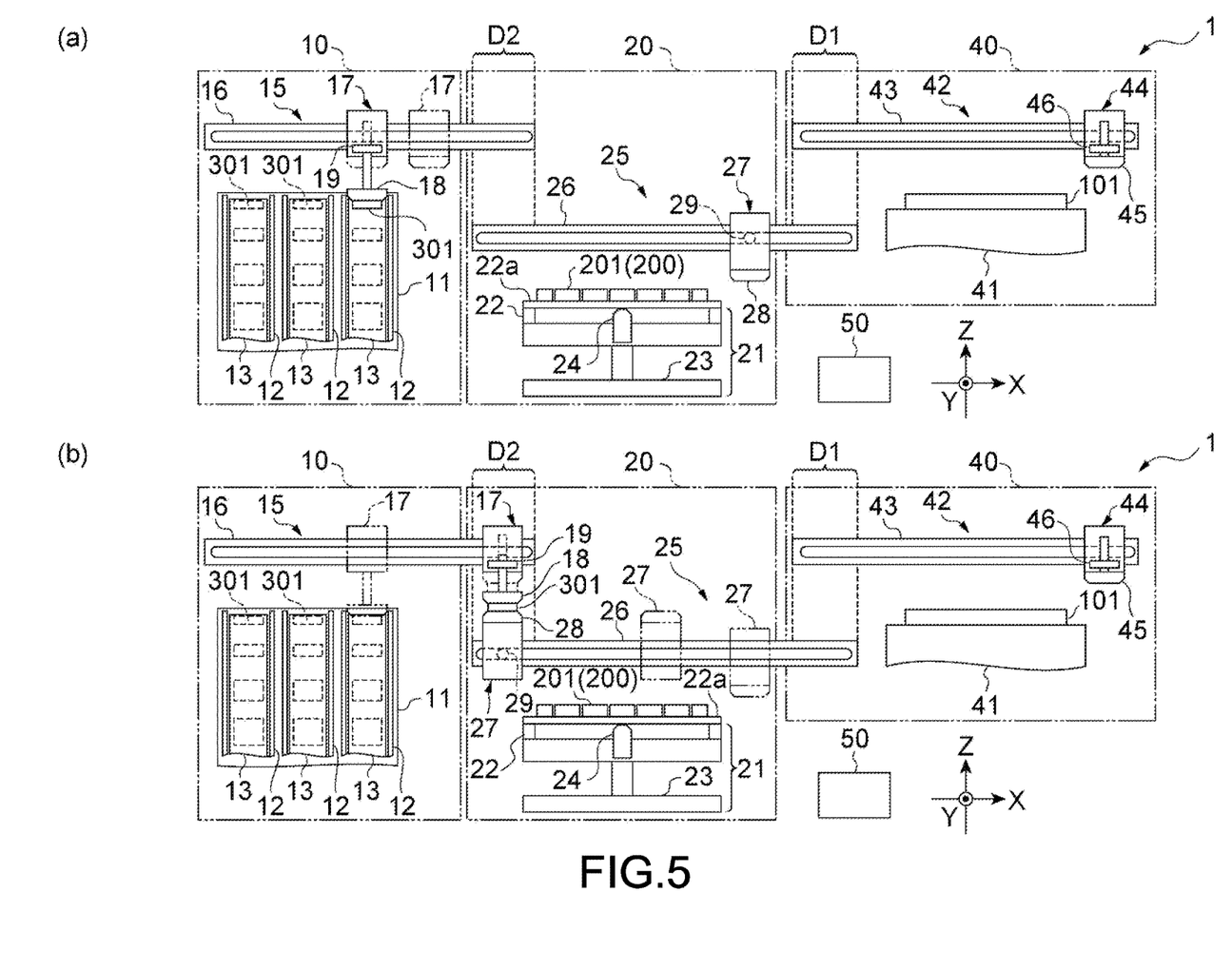

Next, the operation of mounting the electronic component 301 will be described. As shown in (a) of FIG. 5, the controller 50 outputs a control signal to the chip transfer mechanism 15. As a result, the chip transfer mechanism 15 picks up the electronic component 301. The chip transfer mechanism 15 that has received the control signal moves the chip head 17 to a predetermined position by driving the chip transfer guide 16. This predetermined position may be directly above the reel 12 in which the electronic component 301 to be picked up is packed.

Next, the chip transfer mechanism 15 moves the chip head 17 downward (in the negative Z-axis direction) by driving the chip motor 19. This movement continues until the chip head 17 moves to a position where the electronic component 301 can be sucked. Next, the chip transfer mechanism 15 starts the suction operation of the chip nozzle 18.

Next, as shown in (b) of FIG. 5, the controller 50 outputs a control signal to the chip transfer mechanism 15. As a result, the chip transfer mechanism 15 moves the chip head 17 to a position where the electronic component 301 can be delivered. The position capable of delivery may be an overlapping region D2 between the chip transfer guide 16 and the die transfer guide 26. The overlapping region D2 is set in, for example, the die supply module 20. The chip transfer mechanism 15 that has received the control signal moves the chip head 17 in the upward direction (in the positive Z-axis direction) by driving the chip motor 19. Next, the chip transfer mechanism 15 moves the chip head 17 in the positive X-axis direction by the chip transfer guide 16.

Further, the controller 50 outputs a control signal to the die transfer mechanism 25. As a result, the die transfer mechanism 25 moves the die head 27 to a position where the electronic component 301 can be received. The die transfer mechanism 25 that has received the control signal changes the orientation of the die head 27 to be upward by the flip mechanism 29 (flip operation). By this operation, the suction surface of the die nozzle 28 can face the electronic component 301 sucked by the chip nozzle 18. The die transfer mechanism 25 moves the die head 27 in the negative X-axis direction. After that, the die transfer mechanism 25 stops moving when the die head 27 reaches the overlapping region D2.

In addition, the controller 50 may adjust the relative position of the die head 27 with respect to the chip head 17 after the chip head 17 and the die head 27 are moved to the overlapping region D2 respectively.

The controller 50 outputs a control signal to the chip transfer mechanism 15. As a result, the chip transfer mechanism 15 delivers the electronic component 301 from the chip nozzle 18 to the die nozzle 28. The chip transfer mechanism 15 that has received the control signal moves the chip nozzle 18 that has sucked the electronic component 301 downward (in the negative Z-axis direction) by driving the chip motor 19. The chip transfer mechanism 15 brings the chip nozzle 18 close to the die nozzle 28 to a distance where the suction of the electronic component 301 can be stopped. Then, the chip transfer mechanism 15 stops the suction operation of the chip nozzle 18.

Further, the controller 50 outputs a control signal to the die transfer mechanism 25. As a result, the suction operation of the die nozzle 28 is started. The timing for starting this suction operation may be after the electronic component 301 comes into contact with the die nozzle 28. Further, the timing for starting the suction operation may be before the suction operation of the chip nozzle 18 is stopped. When the suction operation of the die nozzle 28 is started and the suction operation of the chip nozzle 18 is stopped, the electronic component 301 is delivered from the chip transfer mechanism 15 to the die transfer mechanism 25.

Figure 6:
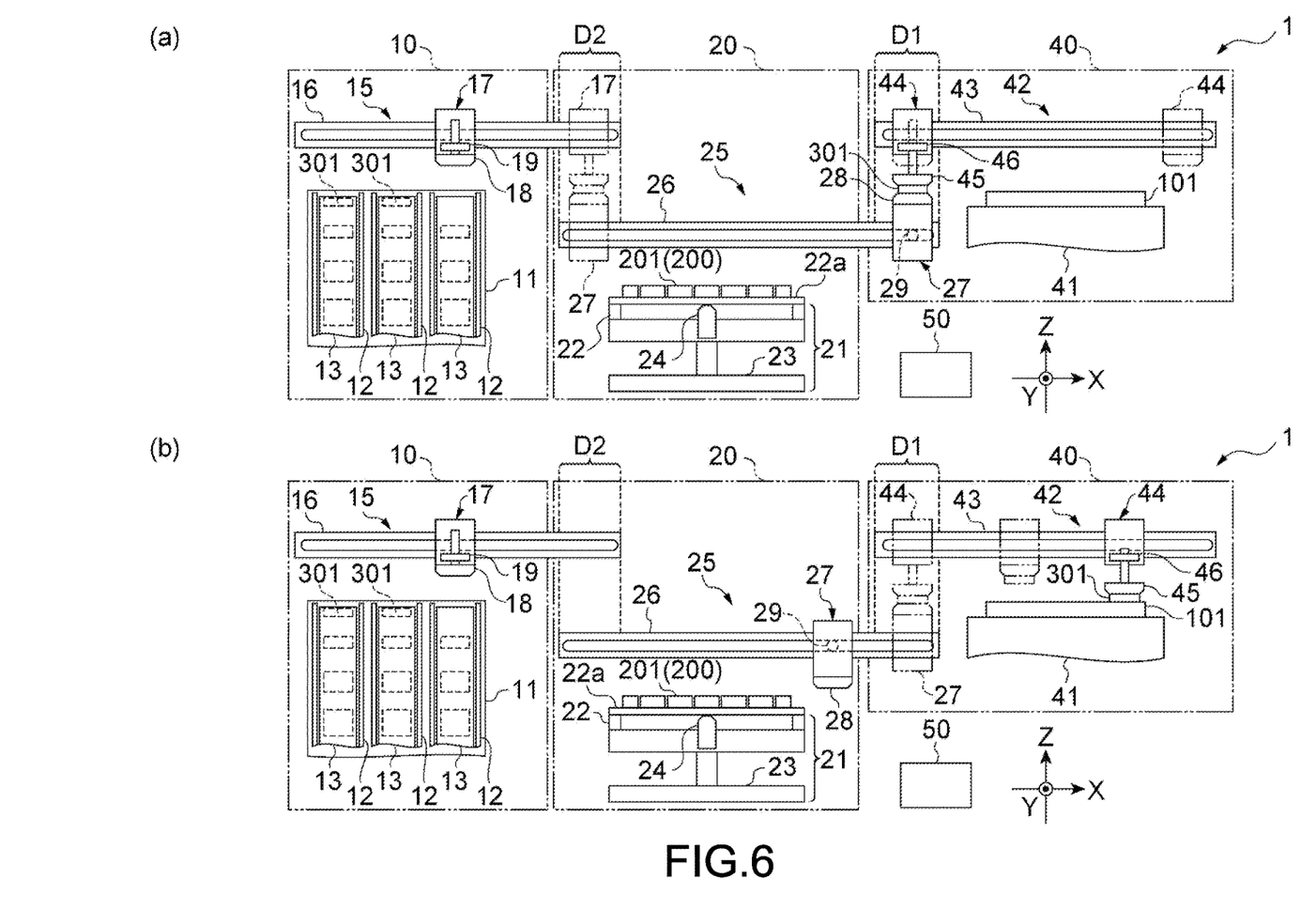

Next, as shown in (a) of FIG. 6, the controller 50 outputs a control signal to the die transfer mechanism 25. As a result, the die transfer mechanism 25 moves the die head 27 holding the electronic component 301 to the overlapping region D1. The die transfer mechanism 25 that has received the control signal moves the die head 27 in the positive X-axis direction. Further, in this operation, since the die head 27 is already facing upward, the die head 27 does not have to perform the flip operation. However, the chip transfer mechanism 15 and the die transfer mechanism 25 may deliver the electronic component 301 to the mounting head 44 in an inverted state depending on the mode in which the electronic component 301 is stored in the carrier tape 13.

Further, the controller 50 also outputs a control signal to the bonding head mechanism 42. As a result, the bonding head mechanism 42 moves the mounting head 44 to the overlapping region D1 where the electronic component 301 can be received. The bonding head mechanism 42 that has received the control signal moves the mounting head 44 in the negative X-axis direction. Then, the movement is stopped when the mounting head 44 reaches the overlapping region D1. The controller 50 outputs a control signal to the bonding head mechanism 42. As a result, the bonding head mechanism 42 receives the electronic component 301. This operation may be the same as the operation when receiving the semiconductor die 201.

As shown in (b) of FIG. 6, the controller 50 outputs a control signal to the bonding head mechanism 42. As a result, the bonding head mechanism 42 bonds the electronic component 301 to the circuit board 101. This operation may be the same as the operation when the semiconductor die 201 is bonded to the circuit board 101.

The semiconductor die 201 is mounted on the circuit board 101 by the above series of operations.

By the way, chip components such as semiconductor dies and electronic components may have different supply methods. For example, semiconductor dies are supplied on a diced wafer. Electronic components are supplied on tape reels. Therefore, a module or mechanism that can support the supply method is required. Therefore, an apparatus corresponding to the supply method was prepared and installed for the bonding module. That is, the components are supplied only from the apparatus connected to the bonding module, and the bonding module cannot receive the supply of multiple types of components. However, as the need for high-mix production in recent years has increased, there is an increasing need to enable the supply of multiple types of components without having to replace the apparatus for supplying the components.

Therefore, the above-described bonding apparatus 1 includes the die supply module 20 that supplies the semiconductor die 201. Further, the bonding apparatus 1 also includes the tape feeder module 10 that supplies the electronic component 301. The bonding module 40 manufactures an electronic device by receiving desired components from the die supply module 20 and the tape feeder module 10. Therefore, the bonding apparatus 1 can support the production of an electronic device including at least one of the semiconductor die 201 and the electronic component 301. As a result, it is possible to support high-mix production of electronic devices.

The bonding apparatus 1 connects the tape feeder module 10 to the die supply module 20. With this configuration, the bonding module 40 can receive both the dicing wafer chip and the tape reel chip. If only the semiconductor die 201 needs to be supplied, the tape feeder module 10 can be removed as needed. According to this removal, the area required for installing the bonding apparatus 1 can be reduced.

In short, the bonding apparatus 1 does not have to replace the tape feeder module 10 and the die supply module 20 with respect to the bonding module 40 according to the components to be supplied to the bonding module 40. That is, the bonding apparatus 1 does not require module replacement.

The above-described bonding apparatus can be modified in various other ways. The above-described embodiments may be combined with each other according to the required purpose and effect.

The bonding apparatus 1 has a configuration in which the tape feeder module 10, the die supply module 20, and the bonding module 40 are arranged in this order along the transfer direction. According to this arrangement, the die transfer mechanism 25 of the die supply module 20 is a common transfer path, and the chip transfer mechanism 15 of the tape feeder module 10 is an independent transfer path.

Figure 7:
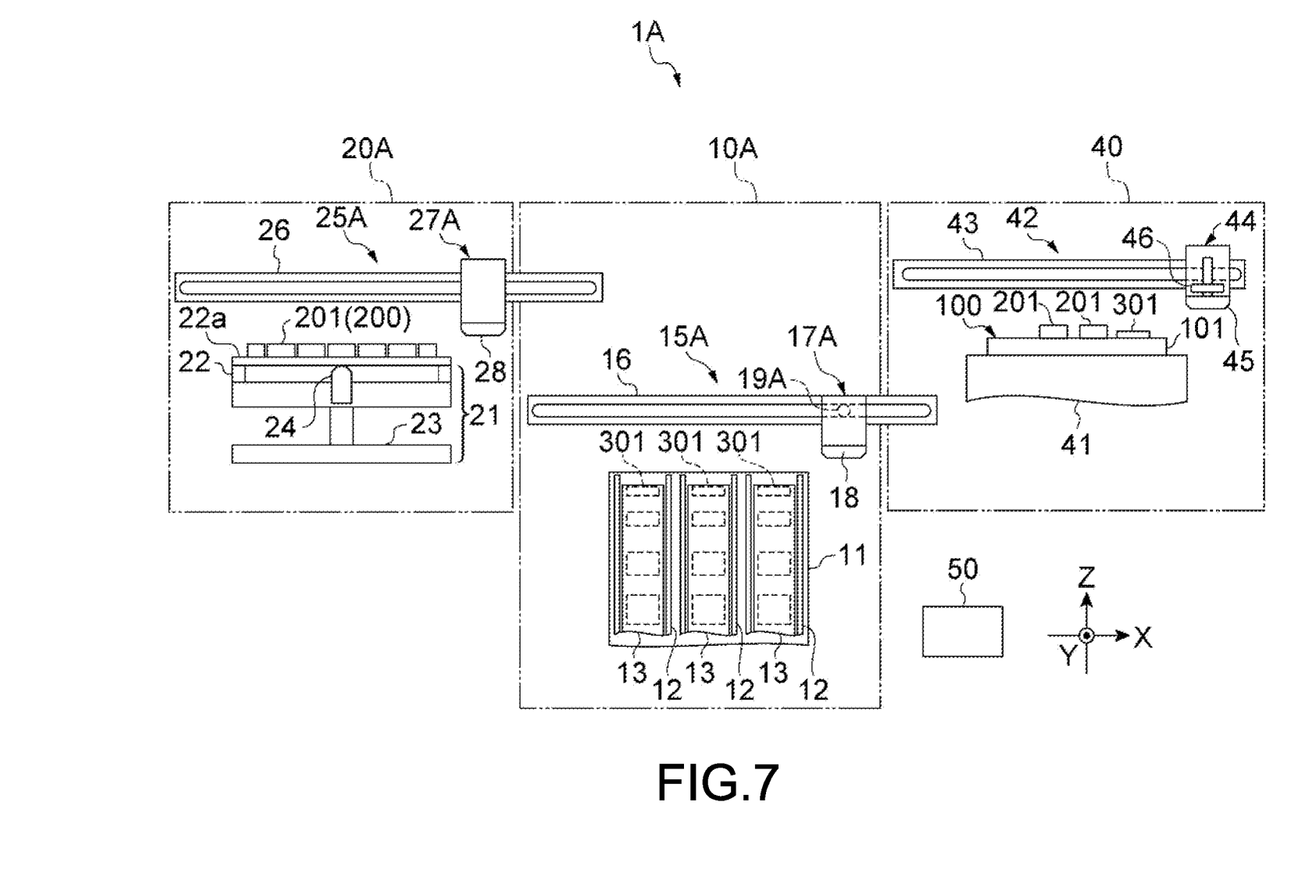
FIG. 7 is a schematic view showing a bonding apparatus according to a modified example.

For example, in a bonding apparatus 1A of a modified example shown in FIG. 7, a die supply module 20A, a tape feeder module 10A, and the bonding module 40 may be arranged in this order along the transfer direction. According to this arrangement, a die transfer mechanism 25A of the die supply module 20A is an independent transfer path, and a chip transfer mechanism 15A of the tape feeder module 10A is a common transfer path. In this configuration, the die transfer mechanism 25A may omit the flip mechanism 29. The chip transfer mechanism 15A may include a flip mechanism 19A. Similar to the bonding apparatus 1, the bonding apparatus 1A having this configuration can also support high-mix production of electronic devices.

What is claimed is:

1. A bonding apparatus comprising:
   an electronic component supply module comprising a carrier tape and a first transfer part adjacent to the carrier tape, the first transfer part taking out an electronic component from the carrier tape and transferring the taken-out electronic component from the electronic component supply module;
   a die supply module comprising a pickup part and a second transfer part adjacent to the pickup part, the picking part picking up a semiconductor die from a wafer bonded to a dicing sheet of the picking part by pushing up the semiconductor die, and the second transfer part transferring out the picked-up semiconductor die from the die supply module; and
   a bonding module bonding at least one of the semiconductor die supplied by the die supply module and the electronic component supplied by the electronic component supply module to a substrate,
   wherein the second transfer part is a common transfer path and receives the electronic component transferred from the first transfer part, both the electronic component and the semiconductor die are transferred to the bonding module through the second transfer part, the first transfer part is an independent transfer path, one of the electronic component and the semiconductor die is transferred out to the common transfer path through the first transfer part, and a region where the first transfer part and the second transfer part overlap is set in the die supply module.

2. The bonding apparatus according to claim 1, wherein the first transfer part is a chip transfer mechanism transferring the electronic component in a predetermined transfer direction, and the second transfer part is a die transfer mechanism transferring the semiconductor die and the electronic component in the predetermined transfer direction.

3. The bonding apparatus according to claim 2, wherein the electronic component supply module, the die supply module, and the bonding module are arranged in sequential order adjacent to each other along the predetermined transfer direction.

4. The bonding apparatus according to claim 3, wherein the bonding module further comprises an arrangement part receiving the electronic component from the first transfer part and arranging the received electronic component on the substrate, and the arrangement part receives the semiconductor die from the second transfer part and arranges the received semiconductor die on the substrate.

5. The bonding apparatus according to claim 2, wherein the bonding module further comprises an arrangement part receiving the electronic component from the first transfer part and arranging the received electronic component on the substrate, and the arrangement part receives the semiconductor die from the second transfer part and arranges the received semiconductor die on the substrate.

6. The bonding apparatus according to claim 1, wherein the bonding module further comprises an arrangement part receiving the electronic component from the first transfer part and arranging the received electronic component on the substrate, and the arrangement part receives the semiconductor die from the second transfer part and arranges the received semiconductor die on the substrate.

7. A bonding apparatus comprising:
   an electronic component supply module comprising a carrier tape and a first transfer part adjacent to the carrier tape, the first transfer part taking out an electronic component from the carrier tape and transferring the taken-out electronic component from the electronic component supply module;
   a die supply module comprising a pickup part and a second transfer part adjacent to the pickup part, the picking part picking up a semiconductor die from a wafer bonded to a dicing sheet of the picking part by pushing up the semiconductor die, and the second transfer part transferring out the picked-up semiconductor die from the die supply module; and
   a bonding module bonding at least one of the semiconductor die supplied by the die supply module and the electronic component supplied by the electronic component supply module to a substrate,
   wherein the first transfer part is a common transfer path and receives the semiconductor die transferred from the second transfer part, both the electronic component and the semiconductor die are transferred to the bonding module through the first transfer part, the second transfer part is an independent transfer path, one of the electronic component and the semiconductor die is transferred out through the second transfer part, and a region where the first transfer part and the second transfer part overlap is set in the electronic component supply module.

\* \* \* \* \*